United States Patent
An et al.

(10) Patent No.: US 9,735,219 B2
(45) Date of Patent: Aug. 15, 2017

(54) ORGANIC LIGHT EMITTING DIODE DISPLAY

(75) Inventors: Chi-Wook An, Yongin (KR); Seung-Gyu Tae, Yongin (KR); Seung-Kyu Lee, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 166 days.

(21) Appl. No.: 13/538,334

(22) Filed: Jun. 29, 2012

(65) Prior Publication Data

US 2013/0207117 A1 Aug. 15, 2013

(30) Foreign Application Priority Data

Feb. 10, 2012 (KR) ........................ 10-2012-0013837

(51) Int. Cl.
*H01L 27/32* (2006.01)
(52) U.S. Cl.
CPC ................................ *H01L 27/3276* (2013.01)
(58) Field of Classification Search
CPC ...................................................... H01L 27/32
USPC ............................................................ 257/71
See application file for complete search history.

(56) References Cited

U.S. PATENT DOCUMENTS

| | | | |
|---|---|---|---|
| 6,351,078 B1 * | 2/2002 | Wang et al. | ............... 315/169.3 |
| 2004/0012744 A1 | 1/2004 | Ishige et al. | |
| 2006/0284556 A1 * | 12/2006 | Tremel et al. | ............... 313/512 |
| 2007/0242016 A1 * | 10/2007 | Choi | ............................ 345/92 |
| 2010/0073266 A1 * | 3/2010 | Na et al. | ......................... 345/76 |
| 2011/0025659 A1 | 2/2011 | Kwak et al. | |

FOREIGN PATENT DOCUMENTS

| | | |
|---|---|---|
| CN | 1485666 | 3/2004 |
| CN | 101999095 | 3/2011 |
| CN | 102194404 | 9/2011 |
| CN | 102243838 | 11/2011 |
| CN | 203150552 | 8/2013 |
| EP | 2091039 | 8/2009 |
| EP | 2275861 | 1/2011 |
| JP | 2004-046103 | 2/2004 |
| JP | 2004-053702 | 2/2004 |
| JP | 2005-091962 | 4/2005 |

(Continued)

OTHER PUBLICATIONS

The extended European Search Report issued by EPO on Oct. 4, 2016 of corresponding European Patent App. No. 13154642.6 which also claims Korean Patent Application No. 10-2012-0013837 as its priority application.

*Primary Examiner* — Kenneth Parker
*Assistant Examiner* — Christopher Culbert
(74) *Attorney, Agent, or Firm* — Robert E. Bushnell, Esq.

(57) ABSTRACT

An organic light emitting diode display includes: first gate wires provided on a substrate with a first insulation layer therebetween and extended in a first direction; second gate wires provided on a second insulation layer above the first insulation layer and extended in the first direction; data wires provided on a third insulation layer above the second insulation layer and extended in a second direction crossing the first direction; a pixel circuit connected to the first gate wires, the second gate wires, and the data wires; and an organic light emitting diode connected to the pixel circuit.

24 Claims, 8 Drawing Sheets

(56) References Cited

FOREIGN PATENT DOCUMENTS

| | | |
|---|---|---|
| JP | 2008-257159 | 10/2008 |
| JP | 2009-047766 | 3/2009 |
| JP | 2009-267426 | 11/2009 |
| JP | 2011-191726 | 9/2011 |
| KR | 10-0685831 | 2/2007 |
| KR | 10-0913794 | 8/2009 |
| KR | 10-2010-0060380 | 6/2010 |
| KR | 10-2011-0036456 | 4/2011 |
| KR | 20110036456 A * | 4/2011 |
| TW | 463393 | 11/2001 |
| TW | 200417800 | 9/2004 |
| TW | 200521590 | 7/2005 |
| WO | 2010/010750 | 1/2010 |

* cited by examiner

ORGANIC LIGHT EMITTING DIODE DISPLAY

CLAIM OF PRIORITY

This application makes reference to, incorporates the same herein, and claims all benefits accruing under 35 U.S.C. §119 from an application earlier filed in the Korean Intellectual Property Office on the 10 Feb. 2012 and there duly assigned Serial No. 10-2012-0013837.

BACKGROUND OF THE INVENTION

Field of the Invention

The described technology relates generally to an organic light emitting diode (OLED) display. More particularly, the described technology relates generally to an organic light emitting diode (OLED) display including a pixel circuit having a plurality of thin film transistors and at least one capacitor.

Description of the Related Art

A display device is a device for displaying images, and recently, a display device including an organic light emitting diode (OLED) has come to prominence.

Unlike a liquid crystal display (LCD), the OLED has the characteristic of self-emission and does not require a light source, so the thickness and weight of an overall display device can be reduced. The OLED exhibits high quality characteristics such as low power consumption, high luminance, and a high response speed.

In general, the organic light emitting diode (OLED) display includes gate wires provided on a substrate and extended in a direction, data wires extended to cross the gate wires, a pixel circuit connected to the gate wires and the data wires, and an organic light emitting diode connected to the pixel circuit.

However, as demands for high-resolution displays have increased, the numbers of gate wires, data wires, pixel circuits, and organic light emitting diodes included in the organic light emitting diode (OLED) display have also increased, so various problems such as distribution of the wires (particularly the gate wires outnumbering the data wires), generation of voltage drop in the wires, and quality deterioration such as stains.

The above information disclosed in this Background section is only for enhancement of understanding of the background of the described technology and therefore it may contain information that does not form the prior art that is already known in this country to a person of ordinary skill in the art.

SUMMARY OF THE INVENTION

The described technology has been made in an effort to provide a high-resolution organic light emitting diode (OLED) display for improving display quality.

An exemplary embodiment provides an organic light emitting diode display including: a first insulation layer formed over a substrate; a plurality of first gate wires, extended in a first direction, provided on the first insulation layer; a second insulation layer formed over the plurality of first gate wires and the first insulation layer; a plurality of second gate wires, extended in the first direction, provided on the second insulation layer; a third insulation layer formed over the plurality of second gate wires and the second insulation layer; a plurality of data wires, extended in a second direction crossing the first direction provided, provided on the third insulation layer; a pixel circuit connected to the first gate wires, the second gate wires, and the data wires; and an organic light emitting diode connected to the pixel circuit.

The first gate wires may not be overlapped by the second gate wires.

The second gate wires include a first scan line and a reset power line separated from the first scan line, the first gate wires include a second scan line and a light emission control line, and the data wires include a data line and a drive power line separated from the data line.

The pixel circuit includes: a first capacitor connected to the reset power line and the drive power line; a first thin film transistor connected between the drive power line and the organic light emitting diode; and a second thin film transistor connected between the data line and the first thin film transistor.

The first capacitor includes: a first capacitor connected to the reset power line and the drive power line; a first thin film transistor connected between the drive power line and the organic light emitting diode; and a second thin film transistor connected between the data line and the first thin film transistor.

The first capacitor includes: a first capacitor electrode formed on the first insulation layer and connected to the reset power line; and a second capacitor electrode formed on the second insulation layer and connected to the drive power line.

The first capacitor may include an active electrode connected to the second capacitor electrode, and the active electrode is provided between the substrate and the first insulation layer corresponding to the first capacitor electrode.

The second capacitor electrode is extended in the first direction.

The first thin film transistor includes: a first active layer, the first insulation layer being formed over the first active layer; a first gate electrode connected to the first capacitor electrode and provided on first insulation layer; a first source electrode connected to the drive power line; and a first drain electrode connected to the organic light emitting diode.

The second thin film transistor includes: a second active layer, the first insulation layer being formed over the second active layer; a second gate electrode connected to the first scan line and provided on the first insulation layer; a second source electrode connected to the data line; and a second drain electrode connected to the first source electrode of the first thin film transistor.

Alternatively, he second thin film transistor may includes: a second active layer, the first insulation layer being formed over the second active layer; a second gate electrode connected to the first scan line and provided on the second insulation layer; a second source electrode connected to the data line; and a second drain electrode connected to the first source electrode of the first thin film transistor.

The pixel circuit further includes a second capacitor including a third capacitor electrode formed on the first insulation layer and connected to the first capacitor electrode, and a fourth capacitor electrode formed on the second insulation layer and connected to the first scan line.

The pixel circuit further includes a third thin film transistor including a third active layer provided between the substrate and the first insulation layer, a third gate electrode connected to the first scan line and provided on the second insulation layer, a third source electrode connected to the first drain electrode of the first thin film transistor, and a third drain electrode connected to the first gate electrode of the first thin film transistor.

The first gate wires include a second scan line, and the pixel circuit further includes a fourth thin film transistor including a fourth active layer provided between the substrate and the first insulation layer, a fourth gate electrode connected to the second scan line and provided on the first insulation layer, a fourth source electrode connected to the reset power line, and a fourth drain electrode connected to the first gate electrode of the first thin film transistor.

The first gate wires further include a light emission control line, and the pixel circuit further includes a fifth thin film transistor including a fifth active layer provided between the substrate and the first insulation layer, a fifth gate electrode connected to the light emission control line and provided on the first insulation layer, a fifth source electrode connected to the drive power line, and a fifth drain electrode connected to the first source electrode of the first thin film transistor.

The pixel circuit further includes a sixth thin film transistor including a sixth active layer provided between the substrate and the first insulation layer, a sixth gate electrode connected to the light emission control line and provided on the first insulation layer, a sixth source electrode connected to the first drain electrode of the first thin film transistor, and a sixth drain electrode connected to the organic light emitting diode.

Another embodiment provides an organic light emitting diode display including: a first insulation layer formed over a substrate; a plurality of first gate wires, extended in a first direction, provided on the first insulation layer; a second insulation layer formed over the plurality of first gate wires and the first insulation layer; a plurality of second gate wires, extended in the first direction, provided on the second insulation layer; a third insulation layer formed over the plurality of second gate wires and the second insulation layer; a plurality of data wires, extended in a second direction crossing the first direction provided, provided on the third insulation layer; a pixel circuit including a plurality of thin film transistors and at least one capacitor connected to the first gate wires, the second gate wires, and the data wires; and an organic light emitting diode connected to a first power via the pixel circuit and further connected to a second power.

A gate electrode of a drive thin film transistor having a source electrode connected to the first power and a drain electrode connected to the organic light emitting diode, from among the plurality of thin film transistors, is provided on the second insulation layer.

A gate electrode of a compensation thin film transistor having a source electrode connected to the drain electrode of the drive thin film transistor and a drain electrode connected to the gate electrode of the drive thin film transistor, from among the plurality of thin film transistors, is provided on the second insulation layer.

A gate electrode of at least one switching thin film transistor, separate from the drive thin film transistor and the compensation thin film transistor, from among the plurality of thin film transistors is provided on the first insulation layer.

A first electrode of the capacitor is provided on the first insulation layer, and a second electrode of the capacitor, facing the first electrode, is provided on the second insulation layer.

According to the exemplary embodiment, the high-resolution organic light emitting diode (OLED) display with improved display quality is provided.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Parts that are irrelevant to the description are omitted in order to clearly describe the present invention, and like reference numerals designate like elements throughout the specification.

In various exemplary embodiments, the same reference numerals are used for elements having the same configurations and will be representatively described in a first exemplary embodiment, and in other exemplary embodiments, only elements different from those of the first exemplary embodiment will be described.

The size and thickness of the components shown the drawings are optionally determined for better understanding and ease of description, and the present invention is not limited to the examples shown in the drawings.

In the drawings, the thickness of layers, films, panels, regions, etc., are exaggerated for clarity. The thickness of some of layers and regions are exaggerated for the sake of explanation. It will be understood that when an element such as a layer, film, region, or plate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Also, throughout the specification, "on" means that an element is positioned on or above or under or below another element, and may not necessarily mean that an element is positioned at an upper side of another element based on a gravity direction.

Further, the attached drawings illustrate an active matrix (AM) display device having a 6Tr-2Cap structure in which a pixel has six thin film transistors (TFTs) and two capacitors, but the present invention is not limited thereto. Therefore, the organic light emitting diode (OLED) display can include a plurality of thin film transistors and at least one capacitor for each pixel, and can further have an additional wire or omit existing wires for various configurations. In this instance, the pixel represents a minimum unit for displaying an image, and the organic light emitting diode (OLED) display expresses the image through a plurality of pixels.

An organic light emitting diode (OLED) display according to a first exemplary embodiment will now be described with reference to FIG. 1 to FIG. 7.

Figure 1:
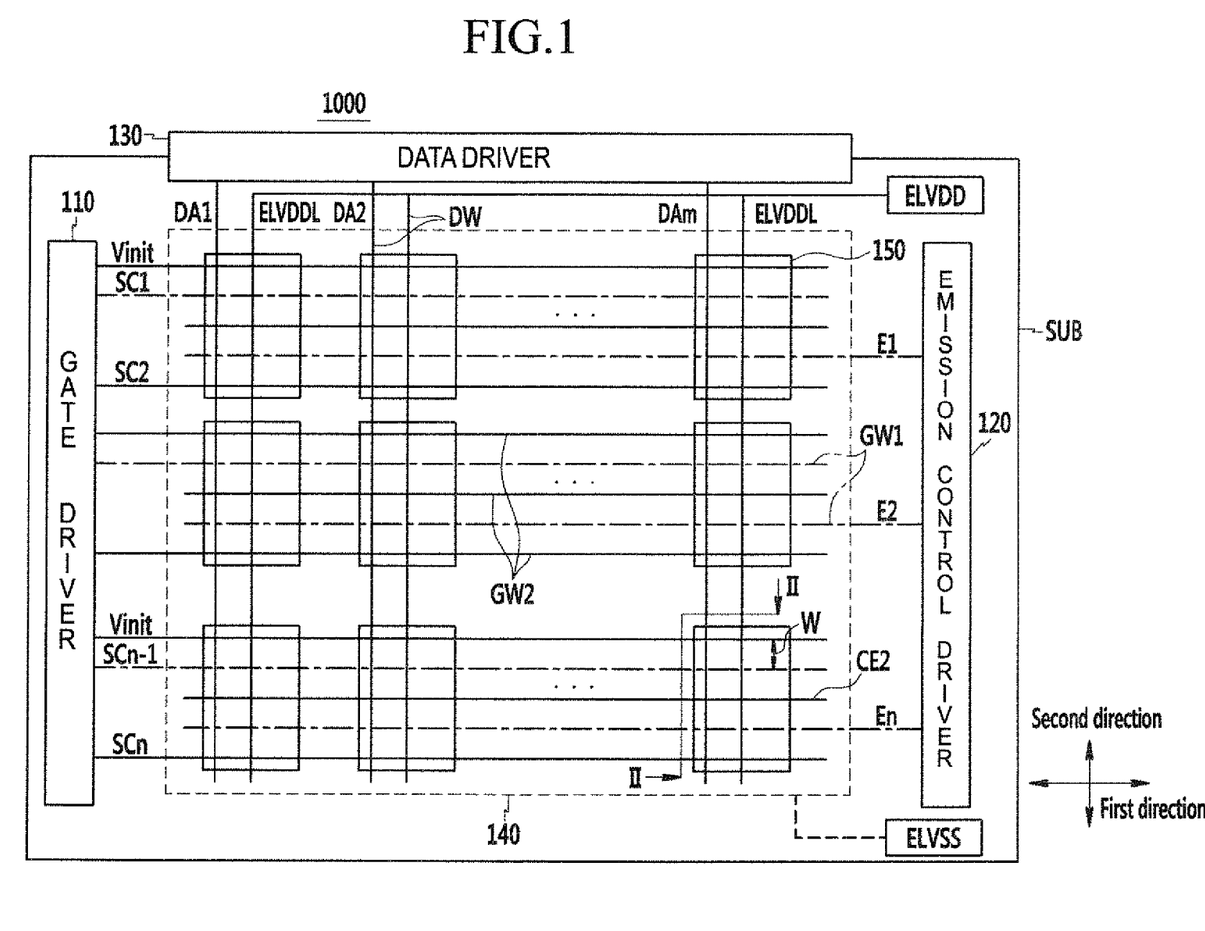
FIG. 1 illustrates an organic light emitting diode (OLED) display according to a first exemplary embodiment of the invention.
Figure 2:
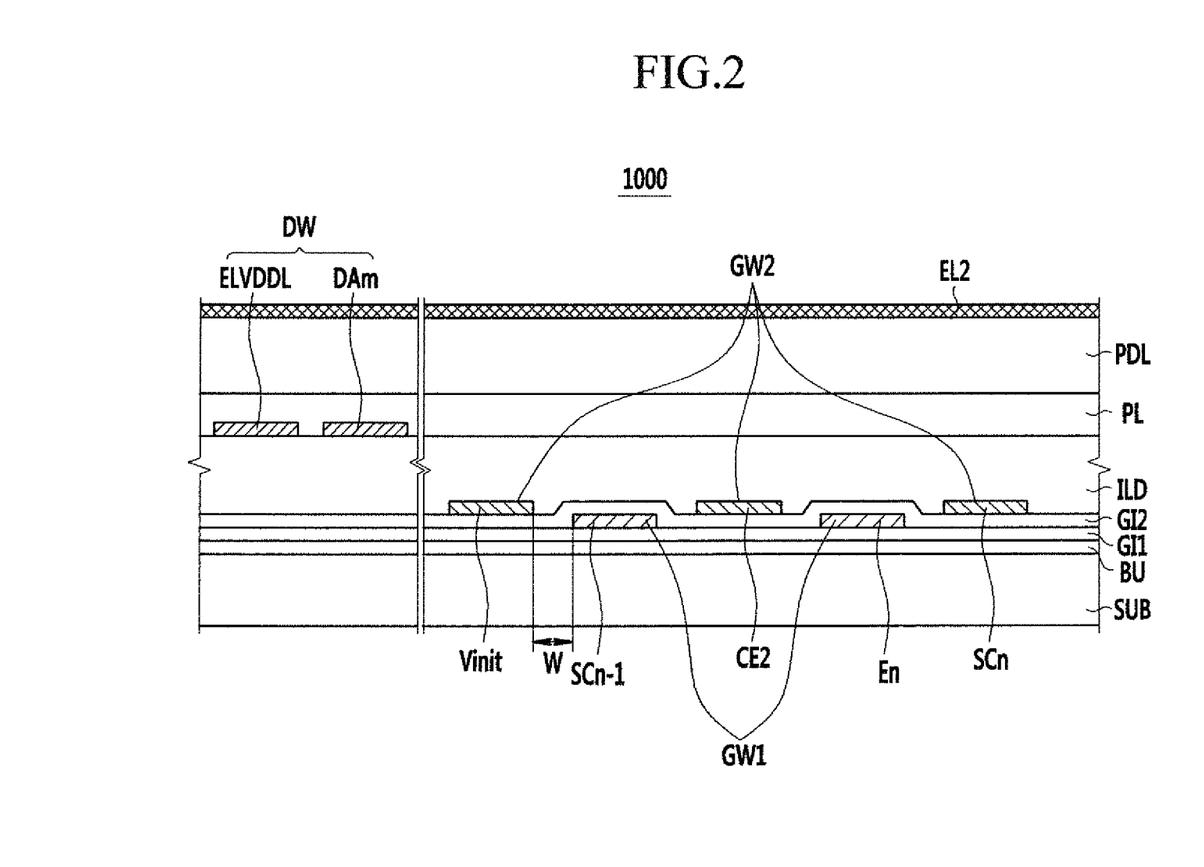
FIG. 2 is a cross-sectional view with respect to a line II-II shown in FIG. 1.

FIG. 1 illustrates an organic light emitting diode (OLED) display according to a first exemplary embodiment. FIG. 2 is a cross-sectional view with respect to a line II-II shown in FIG. 1.

As shown in FIG. 1 and FIG. 2, the organic light emitting diode (OLED) display 1000 includes a gate driver 110, first gate wires GW1, second gate wires GW2, a light emission control driver 120, a data driver 130, data wires (DW), a display 140, and pixels 150.

The gate driver 110 sequentially supplies a scan signal to first scan lines (SC2-SCn) or second scan lines (SC1-SCn−1) included in first gate wires GW1 or second gate wires GW2 according to a control signal provided by an external circuit (not shown), for example, a timing controller. Each pixel 150 is selected by a scan signal and sequentially receives data signals.

As shown in FIGS. 1 and 2, the first gate wires GW1 are provided on a substrate (SUB), with a buffer layer (BU) and a first insulation layer GI1 therebetween, and are extended in a first direction. The first gate wires GW1 include the second scan line (SCn−1) and light emission control line (En). The second scan line (SCn−1) is connected to the gate driver 110 and receives a scan signal from the gate driver 110. The light emission control line (En) is connected to the light emission control driver 120 and receives a light emission control signal from the light emission control driver 120.

Also as shown in FIGS. 1 and 2, the second gate wires GW2 are provided in a separate layer above the first gate wires GW1, with a second insulation layer GI2 therebetween, and are extended in the first direction. The second gate wires GW2 do not overlap the first gate wires GW1. The second gate wires GW2 include the first scan line (SCn) and a reset power line (Vinit). The first scan line (SCn) is connected to the gate driver 110 and receives the scan signal from the gate driver 110. The reset power line (Vinit) is connected to the gate driver 110 and receives a reset power from the gate driver 110.

The reset power line (Vinit) is described to receive the reset power from the gate driver 110 in the first exemplary embodiment, and the reset power line (Vinit) can also be connected to another additional component to receive the reset power therefrom according to another exemplary embodiment.

Also as shown in FIGS. 1 and 2, the light emission control driver 120 sequentially supplies a light emission control signal to the light emission control lines (E1-En) corresponding to a control signal supplied by an external device such as a timing controller. Emission of light by the pixel 150 is then controlled by the light emission control signal. That is, the light emission control signal controls a light emitting time of the pixel 150. Here, the light emission control driver 120 can be omitted depending on an internal configuration of the pixel 150.

Also as shown in FIGS. 1 and 2, the data driver 130 supplies a data signal to the data line (DAm) from among the data wires (DW) corresponding to a control signal provided by an external device such as a timing controller. The data signal supplied to the data line (DAm) is supplied as a pixel 150 selected by the scan signal each time the scan signal is supplied to the first scan line (SCn). The pixel 150 is charged with a voltage that corresponds to the data signal, and emits light with corresponding luminance.

The data wires (DW) are provided in a separate layer above the second gate wires GW2, with a third insulation layer (ILD) therebetween, and are extended in a second direction crossing the first direction. The data wires (DW) include data lines (DA1-DAm) and a drive power line (ELVDDL). The data line (DAm) is connected to the data driver 130 and receives the data signal from the data driver 130. The drive power line (ELVDDL) is connected to a first power (ELVDD) and receives a drive power from the first power (ELVDD). The first power (ELVDD) may be external.

The display 140 includes a plurality of pixels 150 provided at areas where the first gate wires GW1, the second gate wires GW2, and the data wires (DW) cross. In this instance, the pixel 150 includes an organic light emitting diode for emitting light with luminance that corresponds to the driving current that corresponds to the data signal, and a pixel circuit (FIG. 3) for controlling the driving current flowing to the organic light emitting diode. The pixel circuit is connected to the first gate wires GW1, the second gate wires GW2, and the data wires DW, and the organic light emitting diode is connected to the pixel circuit.

The organic light emitting diode of the display 140 is connected to the first power (ELVDD) with the pixel circuit therebetween, and it is connected to a second power (ELVSS), which may also be external. The first power (ELVDD) and the second power (ELVSS) supply drive power and common power to the pixel 150 of the display 140, and the pixel 150 emits light with the luminance that corresponds to the driving current passing through the organic light emitting diode from the first power (ELVDD) corresponding to the data signal according to the drive power and the common power supplied to the pixel 150.

As described, regarding the organic light emitting diode (OLED) display 1000, the first gate wires GW1 include the second scan line (SCn−1) and light emission control line (En) provided on the same layer that cross the pixel 150 in the first direction and that are not overlapped with each other, and the second gate wires GW2 include the first scan line (SCn) and the reset power line (Vinit) provided on the same layer that cross the pixel 150 in the first direction and that are not overlapped with each other, but the first gate wires GW1 and the second gate wires GW2 are provided on different layers with the second insulation layer GI2 therebetween.

Accordingly, a distance (W) between the neighboring gate wires provided on different layers and a greater number of pixels 150 can be formed in the same area. That is, the high-resolution organic light emitting diode (OLED) display 1000 can be formed.

In addition, a second capacitor electrode CE2, as shown in FIGS. 1 and 2, represents an electrode for configuring a first capacitor C1 (FIG. 3), and when the second capacitor electrode CE2 is extended in the first direction if needed, the second capacitor electrode CE2 is formed on the same layer as the second gate wires GW2 to make the distance (W) between the neighboring gate wires narrow and form the high-resolution organic light emitting diode (OLED) display 1000.

Also shown in FIG. 2 is a fourth insulation layer (PL) disposed upon the third insulation layer (ILD) and the data wires (DW), a pixel defining layer (PDL) formed on the fourth insulation layer (PL) and a cathode EL2 formed on the pixel defining layer (PDL).

The pixel 150 according to the first exemplary embodiment will now be described in detail with reference to FIG. 3 and FIG. 4.

Figure 3:
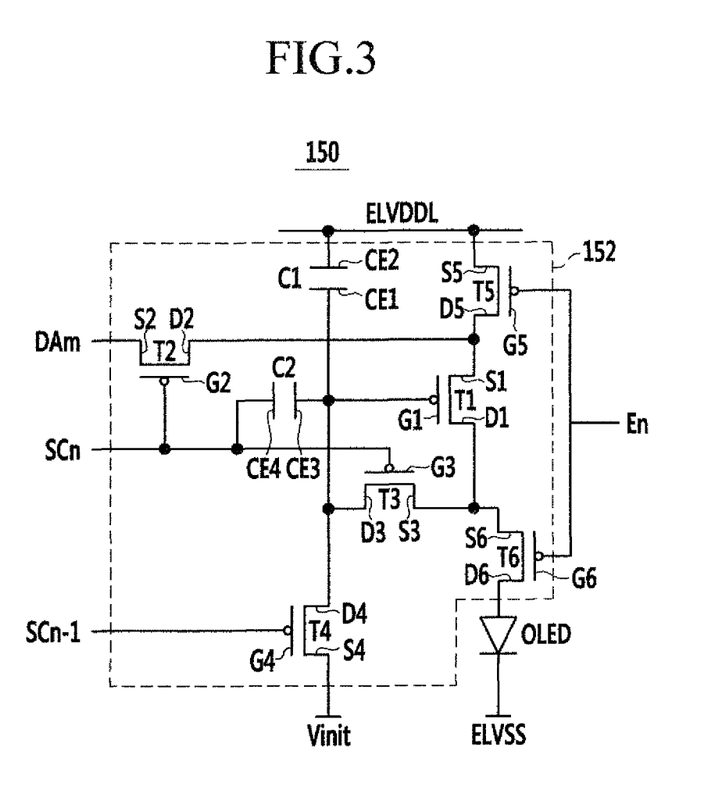
FIG. 3 is a circuit diagram of a pixel shown in FIG. 1.

FIG. 3 shows a circuit diagram of a pixel shown in FIG. 1. FIG. 4 shows a cross-sectional view of a pixel circuit and an organic light emitting diode shown in FIG. 3.

Figure 4:
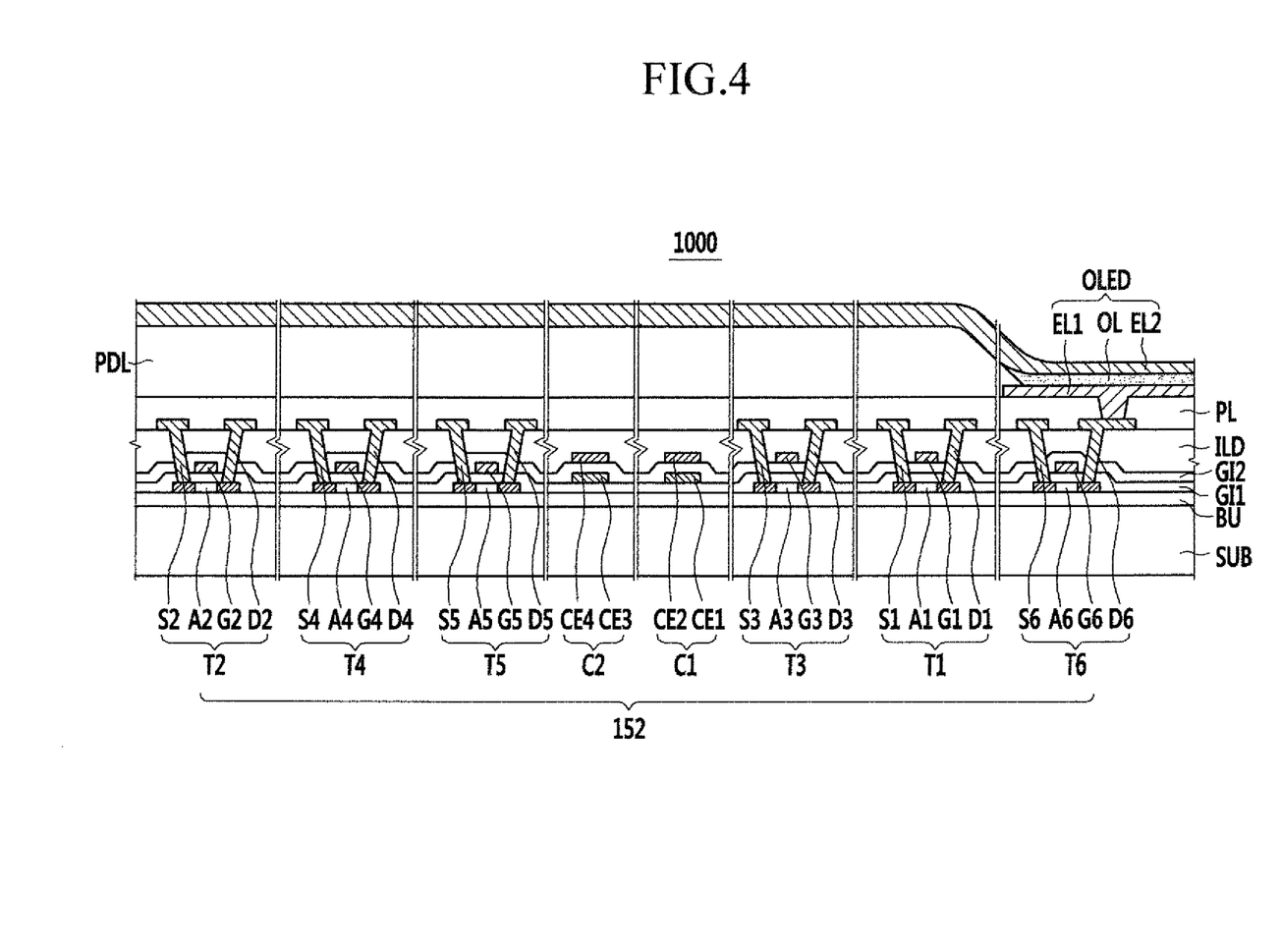
FIG. 4 is a cross-sectional view of a pixel circuit and an organic light emitting diode shown in FIG. 3.

As shown in FIG. 3 and FIG. 4, the pixel 150 includes an organic light emitting diode (OLED) connected between the first power (ELVDD) and the second power (ELVSS), and a pixel circuit 152 connected between the first power (ELVDD) and the organic light emitting diode (OLED) and controlling the drive power supplied to the organic light emitting diode (OLED).

An anode of the organic light emitting diode (OLED) is passed through the pixel circuit 152 and is connected to the drive power line (ELVDDL) connected to the first power (ELVDD), and a cathode of the organic light emitting diode (OLED) is connected to the second power (ELVSS). When the drive power is supplied to the organic light emitting diode (OLED) from the first power (ELVDD) through the pixel circuit 152 and the common power is supplied thereto from the second power (ELVSS), the organic light emitting diode (OLED) emits light with the luminance that corresponds to the driving current flowing to the organic light emitting diode (OLED).

The pixel circuit 152 includes a thin film transistor T1, a thin film transistor T2, a thin film transistor T3, a thin film transistor T4, a thin film transistor T5, a thin film transistor T6, a capacitor C1, and a capacitor C2.

The thin film transistor T1 is connected between the drive power line (ELVDDL) and the organic light emitting diode (OLED), and it supplies drive power corresponding to the data signal to the organic light emitting diode (OLED) from the first power (ELVDD) during the light emitting period of the pixel 150. That is, the thin film transistor T1 functions as a driving transistor of the pixel 150. The thin film transistor T1 includes an active layer A1 (FIG. 4), a gate electrode G1, a source electrode S1, and a drain electrode D1.

The active layer A1 includes polysilicon, and also includes a source region and a drain region to which a doping material is doped and a channel region provided between the source region and the drain region. The active layer A1 is provided between the buffer layer (BU) and the insulation layer GI1 formed on the substrate (SUB).

The insulation layer GI1 and the insulation layer GI2 are provided between the gate electrode G1 and the active layer A2. Accordingly, gate electrode G1 is provided on the same layer as the gate wires GW2, and is connected to a capacitor electrode CE1 of the capacitor C1.

The source electrode S1 is connected to a drive power line (ELVDDL) through the thin film transistor T5.

The drain electrode D1 is connected to the organic light emitting diode (OLED) through the thin film transistor T6.

The thin film transistor T2 is connected between the data line (DAm) and the thin film transistor T1, and transmits the data signal provided by the data line (DAm) to the pixel 150 when the scan signal is supplied from the first scan line (SCn). That is, the thin film transistor T2 functions as a switching transistor of the pixel 150. The thin film transistor T2 includes an active layer A2, a gate electrode G2, a source electrode S2, and a drain electrode D2.

The active layer A2 includes polysilicon, and also includes a source region and a drain region to which a doping material is doped and a channel region provided between the source region and the drain region. The active layer A2 is provided between the buffer layer (BU) and the insulation layer GI1 formed on the substrate (SUB).

The gate electrode G2 is connected to the first scan line (SCn), and is provided on the same layer as the gate wires GW1. That is, the insulation layer GI1 is provided between the second electrode G2 and the active layer A2.

The source electrode S2 is connected to the data line (Dam).

The drain electrode D2 is connected to the source electrode S1 of the thin film transistor T1.

The thin film transistor T3 is connected between the drain electrode D1 of the thin film transistor T1 and the gate electrode G1, and when the data signal is supplied to the pixel 150, the thin film transistor T3 diode-connects the thin film transistor T1 to compensate for a threshold voltage of the thin film transistor T1. That is, the thin film transistor T3 functions as a compensation transistor of the pixel 150. The third film transistor T3 includes an active layer A3, a gate electrode G3, a source electrode S3, and a drain electrode D3.

The active layer A3 includes polysilicon, and it also includes a source region and a drain region to which a doping material is doped and a channel region provided between the source region and the drain region. The active layer A3 is provided between the buffer layer (BU) and the insulation layer GI1 formed on the substrate (SUB).

The gate electrode G3 is connected to the scan line (SCn), and it is provided on the same layer as the gate wires GW2. That is, the insulation layer GI1 and the insulation layer GI2 are provided between the gate electrode G3 and the active layer A3.

The source electrode S3 is connected to the drain electrode D1 of the thin film transistor T1.

The drain electrode D3 is connected to the gate electrode G1 of the thin film transistor T1.

The thin film transistor T4 is connected between the reset power line (Vinit) and the gate electrode G1 of the thin film transistor T1, and it transmits the reset power supplied by the reset power line (Vinit) to the pixel 150 to reset the thin film transistor T1 during a reset period in which the scan signal is supplied from the scan line (SCn−1) in advance of a data programming period in which the data signal is input to the pixel 150 so that the data signal may be fluently supplied to the pixel 150 during the data programming period. That is, the thin film transistor T4 functions as a switching transistor of the pixel 150. The thin film transistor T4 includes an active layer A4, a gate electrode G4, a source electrode S4, and a drain electrode D4.

The active layer A4 includes polysilicon, and also includes a source region and a drain region to which a doping material is doped and a channel region provided between the source region and the drain region. The active layer A4 is provided between the buffer layer (BU) and the insulation layer GI1 formed on the substrate (SUB).

The gate electrode G4 is connected to the scan line (SCn−1) and is provided on the same layer as the gate wires GW1. That is, the insulation layer GI1 is provided between the gate electrode G4 and the active layer A4.

The source electrode S4 is connected to the reset power line (Vinit).

The drain electrode D4 is connected to the gate electrode G1 of the first thin film transistor T1.

The thin film transistor T5 is connected between the drive power line (ELVDDL) and the thin film transistor T1, and it intercepts connection between the first power (ELVDD) and the thin film transistor T1 during a non-light emitting period of the pixel 150, and connects between the first power (ELVDD) and the thin film transistor T1 during a light emitting period of the pixel 150. That is, the thin film transistor T5 functions as a switching transistor of the pixel 150. The thin film transistor T5 includes an active layer A5, a gate electrode G5, a source electrode S5, and a drain electrode D5.

The fifth active layer A5 includes polysilicon, and also includes a source region and a drain region to which a doping material is doped and a channel region provided between the source region and the drain region. The fifth active layer A5 is provided between the buffer layer (BU) and the first insulation layer GI1 formed on the substrate (SUB).

The gate electrode G5 is connected to the light emission control line (En), and is provided on the same layer as the gate wires GW1. That is, the insulation layer GI1 is provided between the gate electrode G5 and the active layer A5.

The source electrode S5 is connected to the drive power line (ELVDDL).

The drain electrode D5 is connected to the source electrode S1 of the thin film transistor T1.

The thin film transistor T6 is connected between the thin film transistor T1 and the organic light emitting diode (OLED), and it intercepts connection between the thin film transistor T1 and the organic light emitting diode (OLED) during the non-light emitting period of the pixel 150, and it connects between the thin film transistor T1 and the organic light emitting diode (OLED) during the light emitting period of the pixel 150. That is, the thin film transistor T6 functions as a switching transistor of the pixel 150. The thin film transistor T6 includes an active layer A6, a gate electrode G6, a source electrode S6, and a drain electrode D6.

The active layer A6 includes polysilicon, and also includes a source region and a drain region to which a doping material is doped and a channel region provided between the source region and the drain region. The active layer A6 is provided between the buffer layer (BU) and the insulation layer GI1 formed on the substrate (SUB).

The gate electrode G6 is connected to the light emission control line (En) and is provided on the same layer as the gate wires GW1. That is, the insulation layer GI1 is provided between the gate electrode G6 and the active layer A6.

The source electrode S6 is connected to the drain electrode D1 of the thin film transistor T1.

The drain electrode D6 is connected to the anode of the organic light emitting diode (OLED).

Source electrode S1 to source electrode S6 and drain electrode D1 to drain electrode D6 of thin film transistor T1 to thin film transistor T6 of organic light emitting diode (OLED) display 1000 according to the first exemplary embodiment are formed on different layers from active layer A1 to active layer A6, without being restricted to this.

That is source electrode S1 to source electrode S6 and drain electrode D1 to drain electrode D6 of thin film transistor T1 to thin film transistor T6 of organic light emitting diode (OLED) display 1000 according to another exemplary embodiment may be selectively formed on the same layer on the same layer as active layer A1 to active layer A6. That is, the source electrodes and the drain electrodes of the thin film transistors can be formed with polysilicon to which a doping material is selectively doped.

The capacitor C1 stores the data signal supplied to the pixel 150 during the data programming period and maintains it for one frame period, and it is connected between the drive power line (ELVDDL) connected to the first power (ELVDD) and the gate electrode G1 of the thin film transistor T1 connected to the reset power line (Vinit). That is, the capacitor C1 functions as a storage capacitor. The capacitor C1 includes a capacitor electrode CE1 and a capacitor electrode CE2.

The capacitor electrode CE1 is connected to the gate electrode G1 of the thin film transistor T1 connected to the reset power line (Vinit), and is provided on the same layer as the gate wires GW1.

The capacitor electrode CE2 is connected to the drive power line (ELVDDL) and is provided on the same layer as the gate wires GW2. As shown in FIG. 1, the capacitor electrode CE2 crosses the neighboring pixel 150 and is then extended in the first direction.

That is, the insulation layer GI2 is provided between the capacitor electrode CE1 and the capacitor electrode CE2.

The capacitor C2 compensates for a voltage drop caused by a load in the organic light emitting diode (OLED) display 1000, and it is connected between the capacitor electrode CE1 of the capacitor C1 and the scan line (SCn). That is, the capacitor C2 increases the voltage at the gate electrode G1 of the thin film transistor T1 by a coupling operation when the voltage level of the current scan signal is changed, particularly when supply of the current scan signal is stopped, so it functions as a boosting capacitor for compensating the voltage drop caused by the load in the organic light emitting diode (OLED) display 1000. The capacitor C2 includes a capacitor electrode CE3 and a capacitor electrode CE4.

The capacitor electrode CE3 is connected to the capacitor electrode CE1 of the capacitor C1, and is provided on the same layer as the gate wires GW1.

The capacitor electrode CE4 is connected to the scan line (SCn), and is provided on the same layer as the gate wires GW2.

That is, the insulation layer GI2 is provided between the capacitor electrode CE3 and the capacitor electrode CE4.

The organic light emitting diode (OLED) is connected to the drain electrode D6 of the thin film transistor T6.

The organic light emitting diode (OLED) includes an anode EL1 provided on the drain electrode D6 via a hole in the insulation layer (PL). The drain electrode D6 is connected to an organic emission layer (OL) which is, in turn, connected to a cathode EL2 connected to the second power (ELVSS). The position of the organic emission layer (OL) can be determined by the pixel defining layer (PDL), and the cathode EL2 can be provided at any position over the pixel defining layer (PDL).

An operation of the pixel 150 will now be described.

During a first period that is set to be a reset period, a low-level previous scan signal is supplied through the scan line (SCn−1). Thin film transistor T4 is turned on corresponding to the low-level previous scan signal, the reset power is supplied to thin film transistor T1 through thin film transistor T4 from the reset power line (Vinit), and thin film transistor T1 is reset.

During a second period that is set to be a data programming period, a low-level current scan signal is supplied through the scan line (SCn). Thin film transistor T2 and thin film transistor T3 are turned on corresponding to the low-level current scan signal. Thin film transistor T1 is turned on through diode-connection by thin film transistor T3, and particularly thin film transistor T1 is reset during the first period so thin film transistor T1 is diode-connected in a forward direction.

Accordingly, the data signal supplied from the data line (DAm) passes through thin film transistor T2, thin film transistor T1, and film transistor T3 so capacitor C1 stores a voltage that corresponds to a difference between the data signal and the threshold voltage of thin film transistor T1.

When the supply of the current scan signal is stopped and the voltage level of the current scan signal is changed to the high level, the voltage applied to gate electrode G1 of thin film transistor T1 is changed corresponding to a voltage change width of the current scan signal according to the coupling operation of capacitor C2. In this instance, the voltage applied to gate electrode G1 of thin film transistor T1 is changed by charge sharing between capacitor C1 and capacitor C2 so the voltage change amount applied to gate electrode G1 is variable by the charge sharing value between capacitor C1 and capacitor C2 as well as the voltage change width of the current scan signal.

During a third period that is set to be a light emitting period, the light emission control signal supplied from the light emission control line (En) is changed to the low level from the high level. During the third period, thin film transistor T5 and thin film transistor T6 are turned on by the low-level light emission control signal. Therefore, the driving current flows to the second power (ELVSS) from the first power (ELVDD) through the drive power line (ELVDDL) according to a path in the order of thin film transistor T5, thin film transistor T1, thin film transistor T6, and the organic light emitting diode (OLED).

The driving current is controlled by thin film transistor T1, and thin film transistor T1 generates a driving current that corresponds to the voltage supplied to gate electrode G1 of thin film transistor T1. In this instance, capacitor C1 stores the voltage to which the threshold voltage of thin film transistor T1 is applied during the second period so the threshold voltage of transistor T1 is compensated during the third period.

The organic light emitting diode (OLED) display 1000 according to the first exemplary embodiment will now be described with reference to FIG. 5 to FIG. 7.

Figure 5:
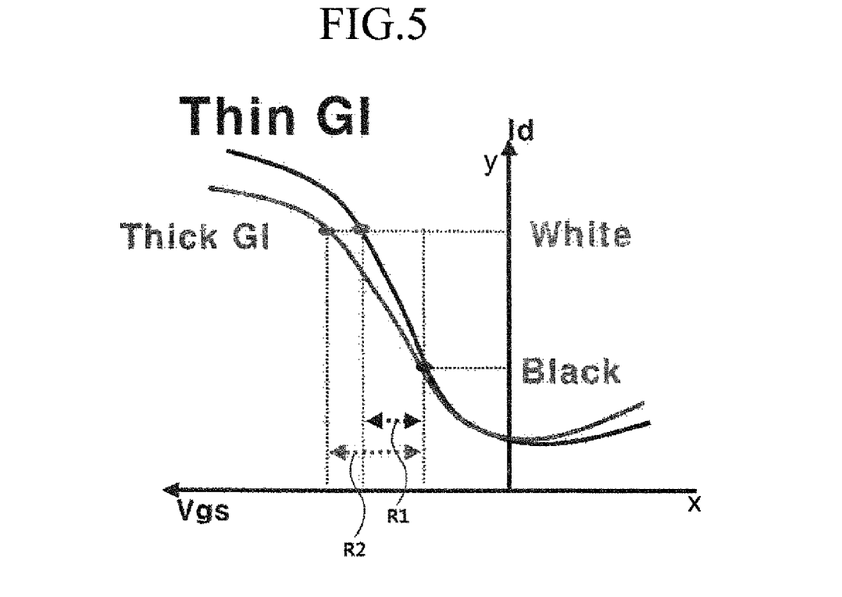
FIG. 5 to FIG. 7 are graphs for describing effects of an organic light emitting diode (OLED) display according to a first exemplary embodiment of the invention.
Figure 6:
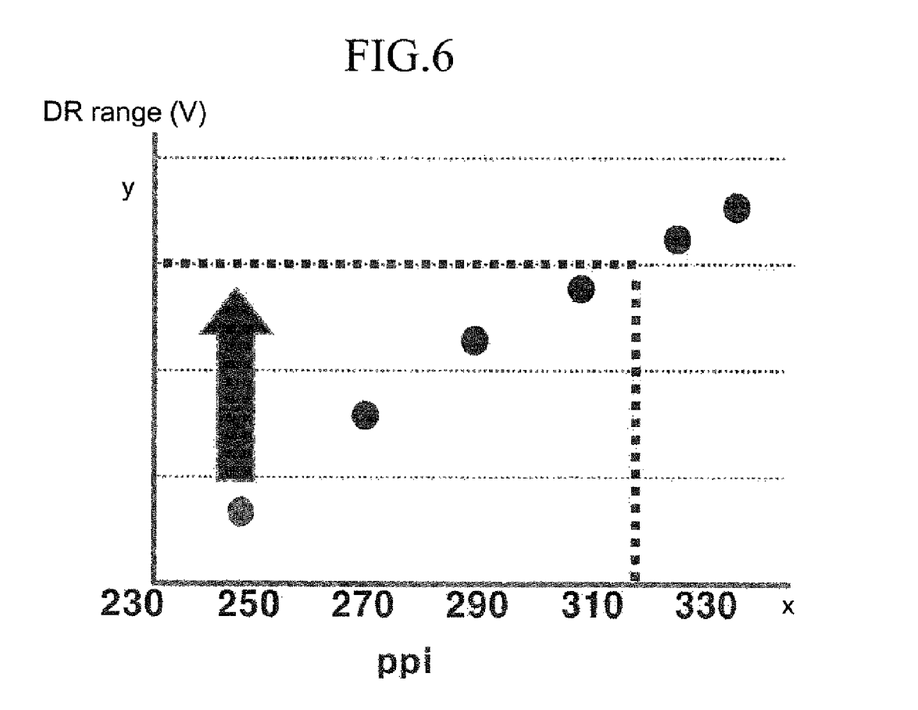
Figure 7:
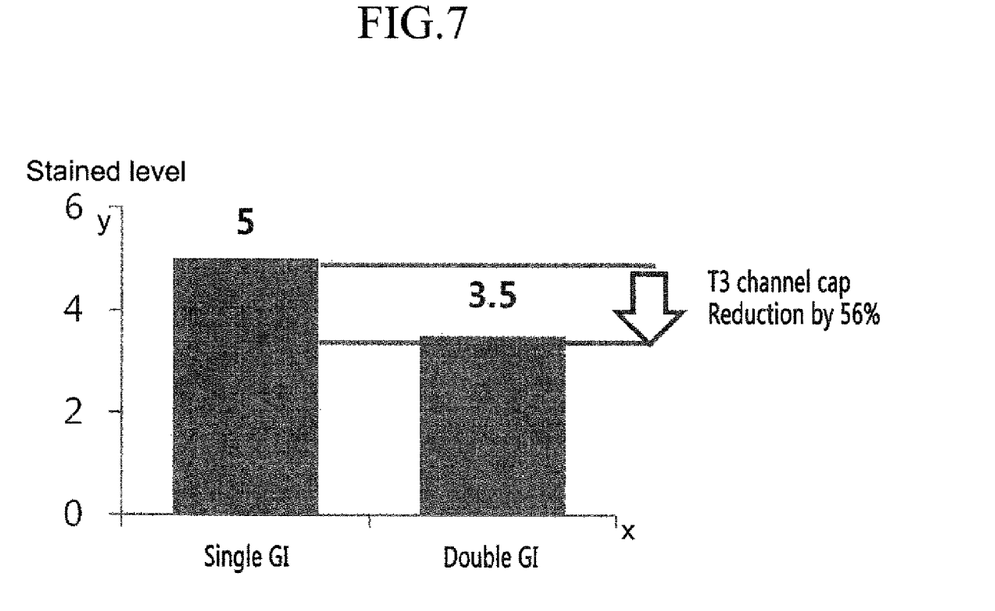

FIG. 5 to FIG. 7 are graphs for describing effects of an organic light emitting diode (OLED) display according to the first exemplary embodiment.

Referring to FIG. 5, the x axis represents a gate voltage (Vgs) applied to the gate electrode of the drive thin film transistor of the organic light emitting diode (OLED) display, the y axis represents a driving current (Id) flowing to the organic light emitting diode of the organic light emitting diode (OLED) display, 'Thin GI' shows that an insulation layer, between an active layer of the drive thin film transistor and the gate electrode, is thin, and 'Thick GI' shows that the insulation layer, between the active layer of the drive thin film transistor and the gate electrode, is thick.

As shown in FIG. 5, when the insulation layer between the active layer and the gate electrode in the drive thin film transistor of the organic light emitting diode (OLED) display is formed as 'Thin GI', and the light emitted by the organic light emitting diode according to the driving current (Id) flowing to the organic light emitting diode is expressed as black and white, the gate voltage (Vgs) applied to the gate electrode of the drive thin film transistor has a first range R1.

That is, when the drive thin film transistor is formed as 'Thin GI', a driving (DR) range (FIG. 6) of the gate voltage (Vgs) applied to the gate electrode has the first range R1.

In addition, when the insulation layer between the active layer and the gate electrode in the drive thin film transistor of the organic light emitting diode (OLED) display is formed as 'Thick GI', and the light emitted by the organic light emitting diode according to the driving current (Id) flowing to the organic light emitting diode is expressed as black and white, the gate voltage (Vgs) applied to the gate electrode of the drive thin film transistor has a second range R2 that is wider than the first range R1. That is, when the drive thin film transistor is formed as 'Thick GI', the driving (DR) range (FIG. 6) of the gate voltage (Vgs) applied to the gate electrode has the second range R2 that is wider than the first range R1.

As described, when the driving (DR) range of the drive thin film transistor has the wider second range R2, the gate voltage (Vgs) applied to the gate electrode of the drive thin film transistor can be controlled so that the light emitted by the organic light emitting diode may have a sufficient grayscale.

Referring to FIG. 6, the x axis represents pixels per inch (ppi) of the organic light emitting diode (OLED) display, and the y axis represents the driving (DR) range of the drive thin film transistor.

As shown in FIG. 6, when the pixels per inch (ppi) of the organic light emitting diode (OLED) display are increased to realize the high-resolution organic light emitting diode (OLED) display, it requires a greater driving range so that the light emitted by the organic light emitting diode may have a sufficient grayscale.

From among the thin film transistor T1, the thin film transistor T2, the thin film transistor T3, the thin film transistor T4, the thin film transistor T5, and the thin film transistor T6, the source electrode S1 of thin film transistor T1 is connected to the drive power line (ELVDDL) connected to the first power (ELVDD), and the gate electrode G1 of thin film transistor T1 having the drain electrode D1 connected to the organic light emitting diode (OLED) is provided on the same layer as the gate wires GW2 so the insulation layer GI1 and the insulation layer GI2 are provided between the gate electrode G1 and the active layer A1 to form the 'Thick GI,' and the organic light emitting diode (OLED) display 1000, according to the first exemplary embodiment, can thus control the organic light emitting diode (OLED) to emit light with sufficient grayscales. That is, the organic light emitting diode (OLED) display 1000 with high resolution, and improved display quality is provided.

Regarding FIG. 7, the x axis represents that the insulation layer between the active layer of the compensation thin film transistor of the organic light emitting diode (OLED) display and the gate electrode a single layer (single GI) and double layers (double GI), and the y axis indicates a stain level occurring on the image displayed by the organic light emitting diode.

As shown in FIG. 7, when the compensation thin film transistor of the organic light emitting diode (OLED) display has the double GI, undesired capacitance (cap) formed on the insulation layer between the gate electrode of the compensation thin film transistor and the active layer is reduced, so the capacitance of the insulation layer between the gate electrode of the compensation thin film transistor and the active layer is reduced by 56 percent compared to the single GI, and the stain level that is generated on the image displayed by the organic light emitting diode is reduced.

In correspondence to the above description, the source electrode S3 of thin film transistor T3 is connected to the drain electrode D1 of thin film transistor T1, and the gate electrode G3 of thin film transistor T3 that is a compensation thin film transistor including the drain electrode D3 connected to the gate electrode G1 of thin film transistor T1 is provided on the same layer as the gate wires GW2, so the insulation layer GI1 and the insulation layer GI2 are provided between the gate electrode G3 and the active layer A3 to form the double GI, and the organic light emitting diode (OLED) display 1000, according to the first exemplary embodiment, thereby minimizes the stain level generated on the image displayed by the organic light emitting diode (OLED). That is, the organic light emitting diode (OLED) display 1000 with high resolution and improved display quality is provided.

Also, regarding the organic light emitting diode (OLED) display 1000, the gate electrode G2, the gate electrode G4, the gate electrode G5, and the gate electrode G6 of second thin film transistor T2, thin film transistor T4, thin film transistor T5, and thin film transistor T6, respectively, are provided on the same insulation layer GI1 as the gate wires GW1, the insulation layer GI1 being provided to cover active layer A2, active layer A4, active layer A5, and active layer A6 to form a thin insulation layer, such that charge mobility of thin film transistor T2, thin film transistor T4, thin film transistor T5, and thin film transistor T6, that are switching thin film transistors, is increased and the threshold voltage is decreased so that thin film transistor T2, thin film transistor T4, thin film transistor T5, and thin film transistor T6 can be quickly turned on and turned off. Hence, a load of the current flowing in the organic light emitting diode (OLED) display 1000 is minimized such that the display quality of the image displayed by the organic light emitting diode (OLED) display 1000 is improved. That is, the organic light emitting diode (OLED) display 1000 with high resolution and improved display quality is provided.

Further, regarding the organic light emitting diode (OLED) display 1000 according to the first exemplary embodiment, capacitor electrode CE1 of capacitor C1 and capacitor electrode CE3 of capacitor C2 are provided on the same layer as the gate wires GW1, and capacitor electrode CE2 of capacitor C1 and capacitor electrode CE4 of capacitor C2 are provided on the same layer as the gate wires GW2, so capacitor C1 and capacitor C2 can be formed with the same material as gate wires GW1 and gate wires GW2, respectively. Accordingly, since capacitor C1 and capacitor C2 do not need to include the polysilicon with irregular intensity of surface illumination, the capacitance is not undesirably transformed by undesired surface transformation of the electrode. That is, capacitor C1 and the second capacitor C2 can store the accurate capacitance that is initially designed, so they accurately control the driving current controllable by thin film transistor T1 and control deterioration of the display quality. That is, the organic light emitting diode (OLED) display 1000 with high resolution and improved display quality is provided.

In addition, regarding the organic light emitting diode (OLED) display 1000 according to the first exemplary embodiment, capacitor electrode CE1 of capacitor C1 and capacitor electrode CE3 of capacitor C2 are provided on the same layer as the gate wires GW1, and capacitor electrode CE2 of capacitor C1 and capacitor electrode CE4 of capacitor C2 are provided on the same layer as the gate wires GW2, so capacitor C1 and capacitor C2 include the single insulation layer GI2 as an insulation layer and each capacitance of capacitor C1 and capacitor C2 is improved. Therefore, since areas of capacitor C1 and capacitor C2 can be reduced, the high-resolution organic light emitting diode (OLED) display 1000 can be formed in the area.

As described, the gate wires are configured with the first gate wires GW1 and the second gate wires GW2 having different layers with each other, the gate electrode of thin film transistor T1 that is a drive thin film transistor and the gate electrode of thin film transistor T3 that is a compensation thin film transistor are provided on the same layer as the gate wires GW2 to have a thick insulation layer, the gate electrodes of thin film transistor T2, thin film transistor T4, thin film transistor T5, and thin film transistor T6 that are switching thin film transistors are provided on the same layer as the gate wires GW1 to have a thin insulation layer, capacitor C1 and capacitor C2 are formed to have a first electrode provided on the same layer as the gate wires GW1 and a second electrode provided on the same layer as the gate wires GW2 so that capacitor C1 and capacitor C2 may have accurate capacitance respectively and may simultaneously have a thin insulation layer, so the organic light emitting diode (OLED) display 1000, according to the first exemplary embodiment, can be formed to be a high-resolution organic light emitting diode (OLED) display with improved display quality.

An organic light emitting diode (OLED) display according to a second exemplary embodiment will now be described with reference to FIG. 8.

Figure 8:
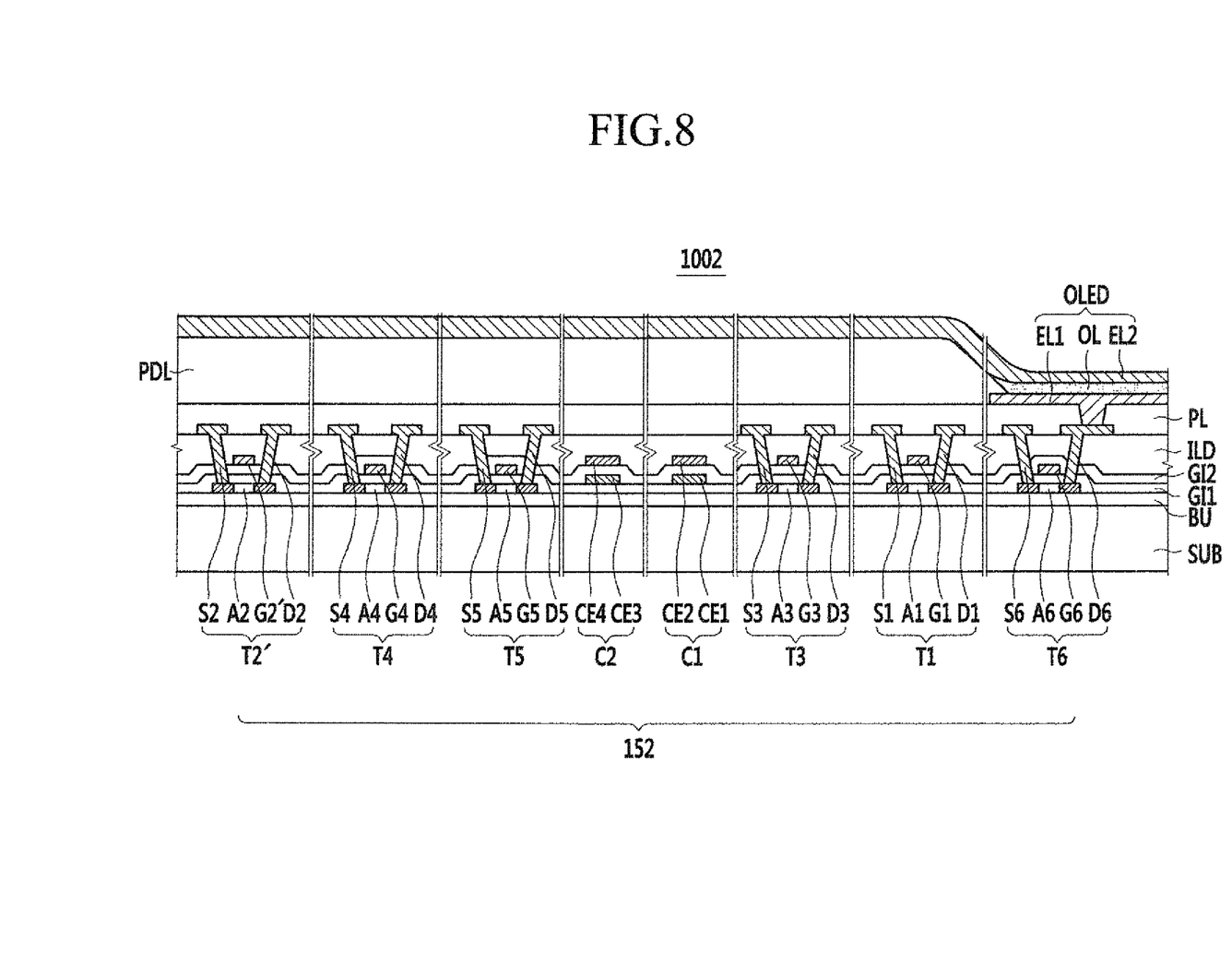
FIG. 8 is a cross-sectional view of a pixel circuit and an organic light emitting diode of an organic light emitting diode (OLED) display according to a second exemplary embodiment of the invention.

FIG. 8 shows a cross-sectional view of a pixel circuit and an organic light emitting diode of an organic light emitting diode (OLED) display according to a second exemplary embodiment.

Parts that are different from the first exemplary embodiment will be described and the parts that are omitted correspond to the first exemplary embodiment. For better comprehension and ease of description, except for the difference between the first and second exemplary embodiments, the second exemplary embodiment will have the same reference numerals for the same constituent elements of the first exemplary embodiment.

As shown in FIG. 8, a gate electrode G2' of a thin film transistor T2' is connected to scan line (SCn) and is provided on the same layer as gate wires GW2.

Hence, regarding the organic light emitting diode (OLED) display 1002 according to the second exemplary embodiment, gate electrode G2' of thin film transistor T2' connected to 'scan line (SCn) provided on the same layer as gate wires GW2 is provided on the same layer as the gate wires GW2, so there is no need to form an additional contact hole for connecting gate electrode G2 and scan line (SCn) and an additional wire connected to the contact hole in the case of forming an entire layout of the pixel 150. Therefore, a high-resolution organic light emitting diode (OLED) display can be manufactured by forming further pixels in the same area.

An organic light emitting diode (OLED) display according to a third exemplary embodiment will now be described with reference to FIG. 9.

Figure 9:
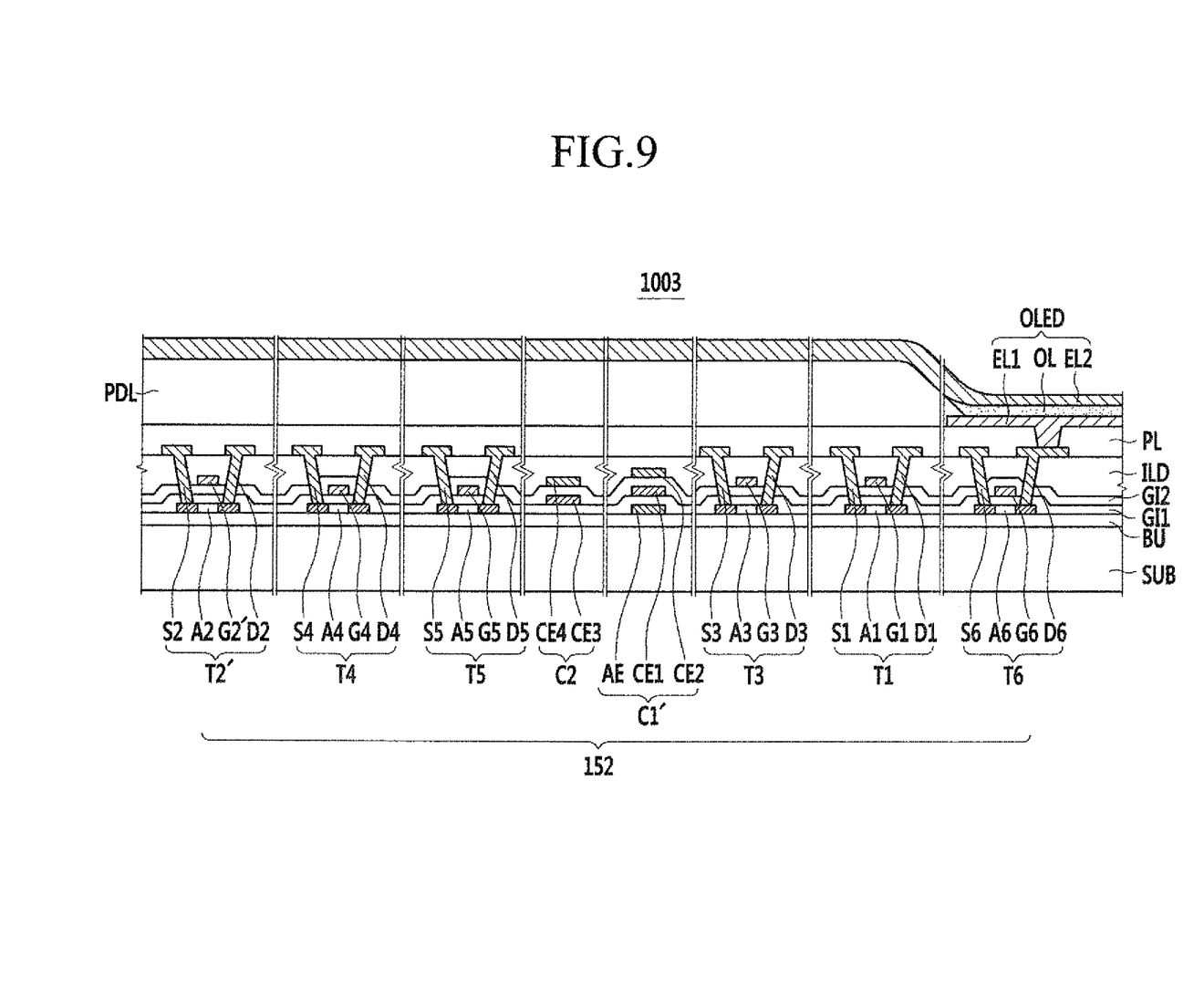
FIG. 9 is a cross-sectional view of a pixel circuit and an organic light emitting diode of an organic light emitting diode (OLED) display according to a third exemplary embodiment of the invention.

FIG. 9 shows a cross-sectional view of a pixel circuit and an organic light emitting diode of an organic light emitting diode (OLED) display according to a third exemplary embodiment.

Parts that are different from the first exemplary embodiment will be described and the parts that are omitted correspond to the second exemplary embodiment. For better comprehension and ease of description, except for the difference between the second and third exemplary embodiments, the third exemplary embodiment will have the same reference numerals for the same constituent element of the second exemplary embodiment.

As shown in FIG. 9, a capacitor C1' further includes an active electrode (AE).

The active electrode (AE) is provided between the substrate (SUB) and the insulation layer GI1 corresponding to capacitor electrode CE1, and is connected to capacitor electrode CE2.

The organic light emitting diode (OLED) display 1003, according to the third exemplary embodiment, is configured with a multi-layered capacitor in which capacitor C1' includes capacitor electrode CE1, capacitor electrode CE2, and active electrode (AE), thereby improving capacitance of capacitor C1'. The area of capacitor C1 is accordingly reduced so the high-resolution organic light emitting diode (OLED) display 1003 can be formed in the same area.

The organic light emitting diode (OLED) display 1003 according to the third exemplary embodiment includes capacitor C1' configured with multi-layered capacitors, and without being restricted to this, capacitor C2 may be configured as multi-layered capacitor including another active electrode in the organic light emitting diode (OLED) display according to another exemplary embodiment.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display device, comprising:
    a first insulation layer formed over a substrate;
    a plurality of first gate wires extending in a first direction and disposed on the first insulation layer;
    a second insulation layer formed over the plurality of first gate wires and the first insulation layer;
    a plurality of second gate wires extending in the first direction and disposed on the second insulation layer;
    a third insulation layer formed over the plurality of second gate wires and the second insulation layer;
    a plurality of data wires extending in a second direction crossing the first direction and disposed on the third insulation layer;
    a pixel circuit connected to the first gate wires, the second gate wires, and the data wires; and
    an organic light emitting diode connected to the pixel circuit,
    wherein the third insulation layer is disposed between the plurality of data wires and the plurality of second gate wires, the pixel circuit comprises a plurality of thin film transistors including an active layer and a gate electrode on the active layer, the gate electrode of at least two thin film transistors of the plurality of thin film transistors is connected to one of the plurality of second gate wires, and the first and second insulation layers are disposed between the gate electrode and the active layer.

2. The organic light emitting diode display device of claim 1, wherein the second gate wires are disposed so as not to overlap the first gate wires.

3. The organic light emitting diode display device of claim 2, wherein the second gate wires include a first scan line and a reset power line separated from the first scan line, and the data wires include a data line and a drive power line separated from the data line.

4. The organic light emitting diode display device of claim 3, wherein the pixel circuit includes:
    a first capacitor connected to the reset power line and the drive power line;
    a first thin film transistor connected between the drive power line and the organic light emitting diode; and
    a second thin film transistor connected between the data line and the first thin film transistor.

5. The organic light emitting diode display device of claim 4, wherein the first capacitor includes:
    a first capacitor electrode formed on the first insulation layer and connected to the reset power line; and
    a second capacitor electrode formed on the second insulation layer and connected to the drive power line.

6. The organic light emitting diode display device of claim 5, wherein the first capacitor further includes an active electrode connected to the second capacitor electrode, and the active electrode is provided between the substrate and the first insulation layer corresponding to the first capacitor electrode.

7. The organic light emitting diode display device of claim 5, the second capacitor electrode being formed so as to extend in the first direction.

8. The organic light emitting diode display device of claim 5, wherein the first thin film transistor includes:
    a first active layer, the first insulation layer being formed over the first active layer;
    a first gate electrode connected to the first capacitor electrode and provided on the first insulation layer;
    a first source electrode connected to the drive power line; and
    a first drain electrode connected to the organic light emitting diode.

9. The organic light emitting diode display device of claim 8, wherein the second thin film transistor includes:
    a second active layer, the first insulation layer being formed over the second active layer;
    a second gate electrode connected to the first scan line and provided on the first insulation layer;
    a second source electrode connected to the data line; and
    a second drain electrode connected to the first source electrode of the first thin film transistor.

10. The organic light emitting diode display device of claim 8, wherein the second thin film transistor includes:
    a second active layer, the first insulation layer being formed over the second active layer;
    a second gate electrode connected to the first scan line and provided on the second insulation layer;
    a second source electrode connected to the data line; and
    a second drain electrode connected to the first source electrode of the first thin film transistor.

11. The organic light emitting diode display device of claim 9, wherein the pixel circuit further includes a second capacitor including a third capacitor electrode formed on the first insulation layer and connected to the first capacitor electrode, and a fourth capacitor electrode formed on the second insulation layer and connected to the first scan line.

12. The organic light emitting diode display device of claim 11, wherein the pixel circuit further includes a third thin film transistor including a third active layer provided between the substrate and the first insulation layer, a third gate electrode connected to the first scan line and provided on the second insulation layer, a third source electrode connected to the first drain electrode of the first thin film transistor, and a third drain electrode connected to the first gate electrode of the first thin film transistor.

13. The organic light emitting diode display device of claim 12, wherein the first gate wires include a second scan line, and the pixel circuit further includes a fourth thin film transistor including a fourth active layer provided between the substrate and the first insulation layer, a fourth gate electrode connected to the second scan line and provided on the first insulation layer, a fourth source electrode connected to the reset power line, and a fourth drain electrode connected to the first gate electrode of the first thin film transistor.

14. The organic light emitting diode display device of claim 13, wherein the first gate wires include a light emission control line, and the pixel circuit further includes a fifth thin film transistor including a fifth active layer provided between the substrate and the first insulation layer, a fifth gate electrode connected to the light emission control line and provided on the first insulation layer, a fifth source electrode connected to the drive power line, and a fifth drain electrode connected to the first source electrode of the first thin film transistor.

15. The organic light emitting diode display device of claim 14, wherein the pixel circuit further includes a sixth thin film transistor including a sixth active layer provided between the substrate and the first insulation layer, a sixth gate electrode connected to the light emission control line and provided on the first insulation layer, a sixth source electrode connected to the first drain electrode of the first thin film transistor, and a sixth drain electrode connected to the organic light emitting diode.

16. An organic light emitting diode display device, comprising:
a first insulation layer formed over a substrate;
a plurality of first gate wires extending in a first direction and disposed on the first insulation layer;
a second insulation layer formed over the plurality of first gate wires and the first insulation layer;
a plurality of second gate wires extending in the first direction and disposed on the second insulation layer;
a third insulation layer formed over the plurality of second gate wires and the second insulation layer;
a plurality of data wires extending in a second direction crossing the first direction and disposed on the third insulation layer;
a pixel circuit including a plurality of thin film transistors and at least one capacitor connected to the first gate wires, the second gate wires, and the data wires; and
an organic light emitting diode connected to a first power via the pixel circuit and further connected to a second power,
the second insulating layer interposed between the first insulating layer and the third insulating layer, wherein the third insulation layer is disposed between the plurality of data wires and the plurality of second gate wires, the pixel circuit comprises a plurality of thin film transistors including an active layer and a gate electrode on the active layer, the gate electrode of at least two thin film transistors of the plurality of thin film transistors is connected to one of the plurality of second gate wires, and the first and second insulation layers are disposed between the gate electrode and the active layer.

17. The organic light emitting diode display device of claim 16, wherein the plurality of thin film transistors includes a drive thin film transistor having a source electrode connected to the first power, a drain electrode connected to the organic light emitting diode, and a gate electrode provided on the second insulation layer.

18. The organic light emitting diode display device of claim 17, wherein the plurality of thin film transistors includes a compensation thin film transistor having a source electrode connected to the drain electrode of the drive thin film transistor, a drain electrode connected to the gate electrode of the drive thin film transistor, and a gate electrode provided on the second insulation layer.

19. The organic light emitting diode display device of claim 18, wherein the plurality of thin film transistors includes at least one switching thin film transistor, separate from the drive thin film transistor and the compensation thin film transistor, and a gate electrode provided on the first insulation layer.

20. The organic light emitting diode display device of claim 16, wherein said at least one capacitor includes a first electrode provided on the first insulation layer, and a second electrode of the capacitor, facing the first electrode, and provided on the second insulation layer.

21. The organic light emitting diode display device of claim 1, wherein the plurality of first gate wires is disposed directly on the first insulation layer.

22. The organic light emitting diode display device of claim 21, wherein the plurality of second gate wires is disposed directly on the second insulation layer.

23. The organic light emitting diode display device of claim 16, wherein the plurality of first gate wires is disposed directly on the first insulation layer.

24. The organic light emitting diode display device of claim 23, wherein the plurality of second gate wires is disposed directly on the second insulation layer.

* * * * *